(12) United States Patent
Inaki et al.

(10) Patent No.: US 6,680,455 B2
(45) Date of Patent: Jan. 20, 2004

(54) PLASMA RESISTANT QUARTZ GLASS JIG

(75) Inventors: Kyoichi Inaki, Tokorozawa (JP); Naoki Hayashi, Hidaka (JP); Tohru Segawa, Koriyama (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 205 days.

(21) Appl. No.: 09/940,077

(22) Filed: Aug. 27, 2001

(65) Prior Publication Data
US 2002/0046992 A1 Apr. 25, 2002

(30) Foreign Application Priority Data

Aug. 29, 2000 (JP) .......................... 2000-259641
Aug. 29, 2000 (JP) .......................... 2000-259645

(51) Int. Cl.[7] .............................................. B23K 10/00
(52) U.S. Cl. .............................. 219/121.43; 219/121.4; 428/141
(58) Field of Search ................ 219/121.43, 121.4, 219/121.59, 121.39; 29/25.01; 65/32.4; 118/500, 728; 428/426, 158, 34.4, 34.6, 304.4, 410, 141; 119/728

(56) References Cited

U.S. PATENT DOCUMENTS

| 5,410,428 | A | * | 4/1995 | Yamagata et al. | .......... 359/350 |
|---|---|---|---|---|---|
| 5,736,206 | A | * | 4/1998 | Englisch et al. | .......... 428/34.6 |
| 5,807,416 | A | * | 9/1998 | Kemmochi et al. | .......... 65/32.4 |
| 5,882,418 | A | * | 3/1999 | Fujii et al. | .................. 118/728 |
| 6,425,168 | B1 | * | 7/2002 | Takaku | ....................... 29/25.01 |
| 6,458,445 | B1 | * | 10/2002 | Inaki | ......................... 428/141 |

FOREIGN PATENT DOCUMENTS

| DE | 197 13 014 A1 | 3/1997 |
|---|---|---|
| EP | 0 763 504 A1 | 3/1997 |
| JP | 10-273339 | 10/1998 |
| JP | 11-106225 | 4/1999 |
| WO | WO 00/48046 | 8/2000 |

OTHER PUBLICATIONS

Patent Abstracts of Japan for JP 10–273339.
Patent Abstracts of Japan for JP 11–106225.

* cited by examiner

Primary Examiner—Quang T. Van
(74) Attorney, Agent, or Firm—Tiajoloff & Kelly; Andrew L. Tiajoloff

(57) ABSTRACT

It is an object of the present invention to provide a quartz glass jig excellent in the plasma etching resistant characteristics, which does not generate an abnormal etching and particles when used for a plasma generating apparatus.

The above Object is obtained by a plasma resistant quartz glass jig that is used for an apparatus of generating plasma, wherein the surface roughness Ra of the quartz glass surface is in a range of from 5 $\mu$m to 0.05 $\mu$m, the number of microcracks of the surface is not more than 500 microcracks/cm$^2$, and the hydrogen molecule concentration in the quartz glass is at least $5 \times 10^{16}$ molecules/cm$^3$.

8 Claims, 1 Drawing Sheet

PLASMA RESISTANT QUARTZ GLASS JIG

BACKGROUND OF THE INVENTION

Field of the Invention

The present invention relates to a quartz glass jig excellent in the plasma etching resistant characteristics, which is used for an apparatus generating plasma.

DESCRIPTION OF RELATED ART

Recently, for the surface treatment of a semiconductor element such as a silicon wafer, etc., an etching treatment utilizing plasma has become frequently used. As the plasma etching method, there are a method of introducing a halogen-base corrosive gas such as a fluorine-base, a chlorine-base, etc., into a plasma-generating chamber. On the other hand, introducing a microwave via a microwave-introducing window to form the plasma of the above described halogen-base corrosive gas existing in the chamber, and treating a semiconductor element, a method for introducing a halogen-base corrosive gas and a microwave in a hanging bell-form quartz glass-made bell jar to form the plasma of the halogen-corrosive gas, and treating a semiconductor element (for example depositing an insulating thin film on the surface of the semiconductor element) is known. In each treatment, an apparatus of generating plasma is used. Also, for the apparatus, quartz glass jigs are mostly used as a window material for introducing a microwave, a bell jar is used as a plasma-generating chamber and a ring for shielding the apparatus. As a material for these jigs natural quartz glass has been mainly used owing to the good electric characteristics and the high purity. The surface of the jig, which is brought into contact with plasma, is roughened by mechanical working to stabilize the etching speed and prevent deposits from being released. For above-described roughening a grinding work using a grindstone with ceramic abrasive grains, diamond abrasive grains, silicon dioxide abrasive grains, etc., are used, also a sand blast work using a powder such as a green carbon powder, a silicon dioxide powder, a ceramic powder, etc., has been employed, but by the mechanical working method, simultaneously with roughening the quartz glass surface, the generation of a microcrack layer occurs. The layer or microcrack portion is attacked by radicals formed in the plasma, consequently the microcrack portions only are etched to form abnormally large holes, and in the worst case, there is a fault that the breakage of the quartz glass jig starts from that portions. Also, recently, it has been confirmed that in the above-described plasma, together with the generation of the ions and radicals, abnormally intense ultraviolet rays and electron rays are emitted from the gas, and it has been found that these rays deteriorate the surface of the quartz glass jig, the deteriorated portions becomes the sources of generating particles, and the generated particles deposit on the surface of a semiconductor element to give secondary bad influences.

Furthermore, there is a problem that impurities sometimes enter the microcracks formed by the mechanical working method, and the impurities are volatized at the treatment of a semiconductor element to contaminate the semiconductor element.

Also, natural quartz glass sometimes contains many bubbles and thus has the fault that even when the surface is roughened by a chemical method, which does not generate microcracks, the surface thereof is deteriorated by usually intense radiations and electron rays emitted in the plasma, when the bubbles are released and exposed on the surface, the deterioration greatly proceeds at the bubble portions to generate particles, which attach onto the surface of a semiconductor element to deteriorate particularly the dielectric breakdown characteristics.

BRIEF SUMMARY OF THE INVENTION

The object of the invention is to provide a quartz glass jig excellent in the plasma etching resistant characteristics, which gives less abnormal etching and less deterioration of the surface of the quartz glass, and does not give contamination of semiconductor elements by the entrance of impurities.

As the results of making intensive investigations about a quartz glass jig used for an apparatus of generating plasma, the present inventors have found that by making the surface roughness Ra of the quartz glass surface of the jig in the range of front 5 $\mu$m to 0.05 $\mu$m, the number of microcracks of the surface 500 microcracks/cm$^2$ or less, and increasing the content of a hydrogen molecules in the quartz glass to at least $5\times10^{16}$ molecules/cm$^3$, a quartz glass jig, which shows less deterioration of the jig surface by etching by plasma and the abnormally intensive ultraviolet rays and electron rays, and does not give bad influences onto a silicon wafer by the generation of particles and impurities.

Furthermore, it has also been found that by establishing the content of bubbles in the above-described quartz glass to 0 or 1 as the bubble classification by DIN, the double refraction amount of the quartz glass to 70 nm/cm or lower, and fictive temperature of the quartz glass to the range of from 800 to 1200° C., a quartz glass jig, which gives a greatly less deterioration by etching by plasma and absolutely intensive ultraviolet rays and electron rays, gives less entrance of impurities by releasing of bubbles, and can carry out well the treatment of semiconductor elements, is obtained, and the present invention has been accomplished.

The present invention attaining the above-described object is a plasma resistant quartz glass jig that is used for an apparatus generating plasma, characterized in that the surface roughness Ra of the quartz glass surface is from 5 $\mu$m to 0.05 $\mu$m, the number of microcracks of the surface is 500 microcracks/cm$^2$ or less, and the hydrogen molecule concentration in the quartz glass is at least $5\times10^{16}$ molecules/cm$^3$.

The quartz glass jig of the invention is the jig prepared by a natural or synthetic quartz glass, and the inner surface thereof, which is brought into contact with plasma, is roughened in the range of from 5 $\mu$m to 0.05 $\mu$m as the surface roughness of Ra for stabilizing the etching speed and preventing release of deposits. When the surface roughness Ra exceeds 5 $\mu$m, the radicals and ions generated in plasma locally attack the concaved portions and thus abnormal etching proceeds. Also, when the surface roughness Ra is less than 0.05 $\mu$m, there is a danger that secondary products (for example, particles, etc.) formed by a plasma are liable to be released from the surface and they deposit on the surface of the semiconductor element (e.g. silicon wafer) to largely reduce the characteristics of the semiconductor element.

Also, the quartz glass jig of the invention is the jig wherein the number of microcracks of the surface is not more than 500 microcracks/cm$^2$. When the number of the microcracks of the surface of the jig exceeds the above-described range, the proceed of etching becomes faster by attacking by the radicals generated in the plasma, the microcracks become large, and in the worst case, the breakage of the quartz glass starts from that portion. The quartz glass jig wherein the above-described number of the microcracks is not more than 500 microcracks/cm$^2$ can be prepared by a chemical treatment such as the method of immersing a quartz glass jig in a solution of hydrofluoric acid, ammonium fluoride and acetic acid to deposit fine particles of ammonium silicofluoride as described in Japanese Patent Laid-Open No. 273339/1998, the method of forming the thin film of silicone, etc., and applying an etching treatment with an aqueous solution of hydrofluoric acid as described in Japanese Patent Laid-Open No. 106225/1999, etc. In the case of roughening by the chemical treatment, it is important to control the reaction of the etching chemical liquid and the quartz glass, and particularly, in the case of a synthetic quartz glass, the temperature management of the chemical liquid is necessary and it is better that the temperature of the chemical liquid is controlled in the range of 20° C. ±2° C. When the temperature is outside of the above-described temperature range, the surface roughness Ra of the quartz glass surface cannot be made from 5 μm to 0.05 μm. The number of the microcracks of the quartz glass surface can be measured by observing the microphotograph. Of course it is even better when no microcrack layer exists on the surface of the quartz glass jig of the invention.

Furthermore, in the quartz glass jig of the invention, the hydrogen molecule concentration is at least $5\times10^{16}$ molecules/cm$^3$. By having the hydrogen molecule concentration, the formation of the E' center absorption bond is restrained, the inner strain in the network structure of the quartz glass is removed, the break of the Si—O bond by the abnormally intense ultraviolet rays and electron rays in the plasma becomes less, the increase of the density of the quartz glass is restrained, and the generation of large microcracks and the generation of particles become less. The above-described hydrogen molecule concentration is obtained by controlling the hydrogen molecular weight in a flame at the production of the quartz glass or by treating the quartz glass in a hydrogen gas atmosphere of a normal pressure or under pressure at a temperature of from 100 to 900° C. for from 1 to 100 hours, and the measurement is by a laser Raman method.

In addition to the above-described matters, in the quartz glass of the invention, it is better that the content of bubbles is 0 or 1 as the bubble classification by DIN. When the quartz glass contains bubbles exceeding the above-described range, the bubbles are eroded by the radicals and the ions generated in the plasma and released to become precursors of abnormal holes, and the deterioration further proceeds by the abnormally intense radiations and electron rays in succession thereof to form large holes and generate particles. The term that the content of bubbles is 0 or 1 as the bubble classification by DIN described above is that according to DIN (Deutsche Industrie Norm) 58927 which is herein incorporated by reference, the total cross sections (cm$^2$) of the bubbles existing in 100 cm$^3$ are from 0 to 0.03 when the classification is 0, and are from 0.03 to 0.10 when the classification is 1. As the quartz glass wherein the bubble classification by DIN is 0 or 1, there are commercially available HERA LUX and SUPRASIL (manufactured by Shin-Etsu Sekiei K. K. and Heraeus Quarzglas GmbH & Co. KG).

In addition it is also important that the quartz glass is homogeneous such that the double refraction amount is not higher than 70 nm/cm. Also, when the double refraction amount of the quartz glass exceeds the above-described range, the increase of the density of the quartz glass proceeds by the abnormally intense ultraviolet rays and electron rays irradiated to the twisted portion and microcracks become large. For effectively preventing the increase of the density of the quartz glass by the abnormally intense ultraviolet rays and electron rays, it is better that the fictive temperature of the quartz glass is established to the range of from 800 to 1200° C. By establishing the fictive temperature to the above-described range, the density of the quartz glass is lowered to relax the structure, by the irradiation of the abnormally intense ultraviolet rays and electron rays, defects are hard to generate and the increase of the density can be prevented.

In the quartz glass jig of the invention, a fine roughness is formed on the surface as described above, which largely acts on the transmittance of ultraviolet rays. When the transmittance is small, the quartz glass surface is deteriorated by ultraviolet rays. Particularly, The Si—O bond of the quartz glass is broken by abnormally intense ultraviolet rays and electron rays simultaneously generating with the radicals and the ions in the plasma to form a defect, the density becomes high, microcracks become large, the etching speed is greatly accelerated, and large holes are formed. For preventing the occurrence of the deterioration of the quartz glass by ultraviolet rays, it is better that the inner transmittance of the quartz glass is at least 80% as the transmittance of ultraviolet rays, and the apparent transmittance is from 30 to 85%. It is impossible that the appearance transmittance exceeds 85% because the surface becomes rough, and also, when the apparent transmittance is less than 30%, it cannot be prevented surface of the quartz glass from becoming precise. The above-described inner transmittance means the transmittance, which does not contain the reflection loss at the outer surface of the quartz glass, and the transmittance containing the reflection loss is called an apparent transmittance.

As the quartz glass, wherein the bubble classification by DIN is 0 or 1 and the double refraction amount is in the above-described range, there is suitably a synthetic quartz glass obtained by hydrolyzing a silicon compound in the vapor phase. Also, the establishment of the fictive temperature of the quartz glass is carried out by heating the quartz glass to a temperature of from 800 to 1200° C. for a definite time. The measurement of the fictive temperature is by a laser Raman method.

The quartz glass jig of the invention is prepared by a natural or synthetic quartz glass as described above, and a synthetic quartz glass, which has less content of bubbles and can be easily obtained as a quartz glass having a high homogeneity, is particularly preferred.

DETAILED DESCRIPTION

Mode for Carrying out the Invention

Then, the invention is explained in detail by the practical examples but the examples are shown for illustration and the invention is not limited to those examples.

EXAMPLES

Example 1

Figure 1:
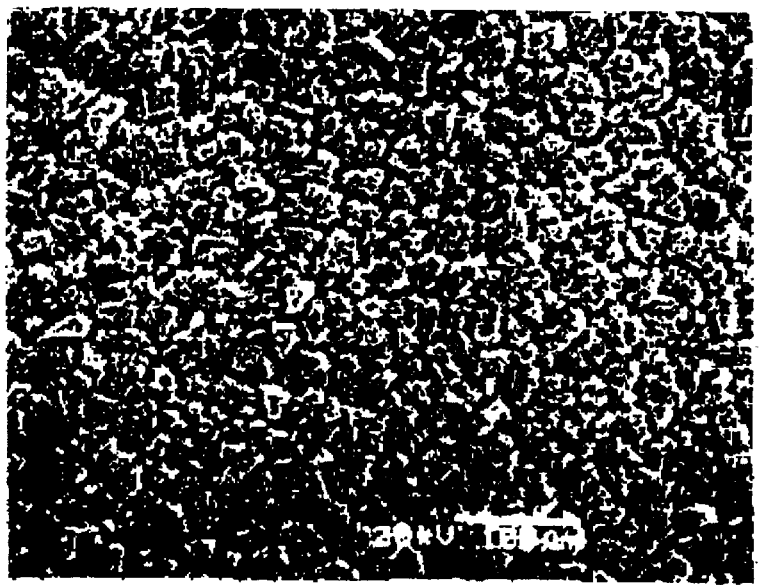
FIG. 1 is a microphotograph of 100 magnification of the surface of the quartz glass frost-treated in Example 1 after etching with 5% HF for 2 hours.
Figure 2:
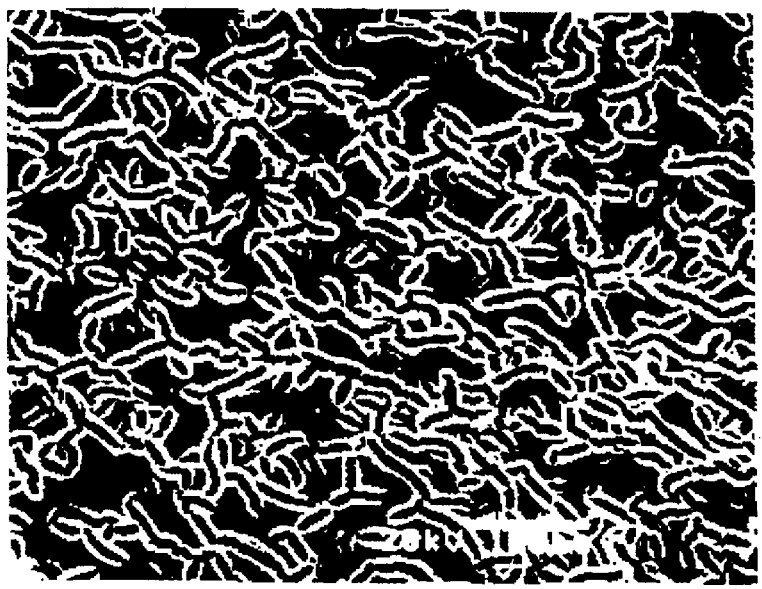
FIG. 2 is a microphotograph of 100 magnification of the surface of a sand-blasted quartz glass after etching with 5% HF for 2 hours.

By hydrolyzing silicon tetrachloride in the vapor phase, a synthetic quartz glass, wherein the hydrogen molecule concentration was $15\times10^{16}$ molecules/cm$^3$ and the bubble classification by DIN was 0, was obtained. Then, using the quartz glass, a window material of a plasma-generating apparatus was prepared, and the window material was immersed in a frost treatment liquid of about 24% by weight of 50% hydrofluoric acid □ about 17% by weight of ammonium fluoride, about 35% by weight of 100% acetic acid, and about 24% by weight of water to deposit fine crystals of ammonium silicofluoride, whereby the quartz glass-made window material, wherein the surface roughness Ra was 0.5 μm and Rmax was 2 μm, was obtained. The photograph in the case of etching the quartz glass subjected to the above-described frost treatment with 5% hydrofluoric acid for 2 hours is shown in FIG. 1. As shown in FIG. 1, in the quartz glass, microcracks did not exist. Using the window material obtained, as the microwave-introducing window material of a plasma-generating apparatus having an output of 1 KW, into which gases of CF$_4$/O$_2$ were introduced, and etching treatment of silicon wafers was carried out. In this case, 10,000 silicon wafers were treated but an abnormal increase of particles was not confirmed.

Comparative Example 1

By following the same procedure as Example 1 except that a synthetic quartz glass having a hydrogen molecule concentration of $3\times10^{16}$ molecules/cm$^3$ in Example 1 was used, a quartz glass-made window material was prepared and when the etching treatment of silicon wafers was carried out, at the treatment of 5000 silicon wafers, an abnormal increase of particles was confirmed.

Comparative Example 2

By carrying out the frost-treatment by the same method as Example 1 except that a natural quartz glass wherein the bubble classification by DIN was 2 was immersed in the frost-treatment liquid used in Example 1, a window material was prepared. When the etching treatment of Si wafers as in Example 1 was carried out, at the case of treating 2000 Si wafers, an abnormal generation of particles was confirmed.

Comparative Example 3

The surface of a natural quartz glass wherein the bubble classification by DIN was 2 was subjected to a sand-blast with SiC particles of #180. In the quartz glass obtained, the existence of a microcrack layer was confirmed. A quartz glass window material was prepared using the quartz glass and when the etching treatment of Si wafers was carried out as in Example 1, from the first, particles were generated and the etching treatment could not be carried out.

Example 2

A synthetic quartz glass obtained by hydrolyzing silicon tetrachloride in the vapor phase as in Example 1 was subjected to a homogenization treatment of 1000° C. to obtain a synthetic quartz glass having a double refraction amount of 20 nm/cm. The synthetic quartz glass was subjected to a hydrogen doping treatment. Then, by applying the frost treatment as in Example 1, a synthetic quartz glass having the surface roughness Ra of 0.5 μm, and Rmax of 2 μm was obtained. A window material was prepared with the synthetic quartz glass, and after heating to 1100° C. for 20 hours, the material was gradually cooled. The fictive temperature of the quartz glass-made window material obtained was 1100° C. In a plasma apparatus using the synthetic quartz glass-made window material, which had an output of 1 KW and into which gases of CF$_4$/O$_2$ were introduced, an etching treatment of silicon wafers was carried out. When 7000 silicon wafers were treated, an abnormal increase of particles was not confirmed.

Comparative Example 4

When the double refraction amount and the fictive temperature were measured about the quartz glass, in which the homogenization treatment and the fictive temperature were not established in Example 2, the double refraction amount of 200 nm/cm and the fictive temperature was 1300° C. Using the quartz glass, a quartz glass-made window material was prepared, the material was mounted on a plasma apparatus having an output of 1 KW, into which gases of CF$_4$/O$_2$ were introduced as in Example 1, and an etching treatment of silicon wafers was carried out. When 1000 silicon wafers were treated, an abnormal increase of particles was confirmed.

Advantage of the Invention

The quartz glass jig of the invention is the jig, wherein the surface roughness Ra is from 5 μm to 0.05 μm, the number of microcracks of the front surface is not more than 500 microcracks/cm$^2$, the hydrogen molecule concentration in the quartz glass is at least $5\times10^{16}$ molecules/cm$^3$, and the quartz glass jig is used as the jig for an apparatus of generating plasma, the occurrence of abnormal etching and the generation of particles are less and good semiconductor elements can be produced.

What is claimed is:

1. A quartz glass jig for use in an apparatus for generating plasma, said jig comprising:
   a quartz glass portion of quartz glass and having a quartz glass surface;
   said quartz glass surface having a surface roughness Ra in the range of 5 μm to 0.05 μm;
   said quartz glass surface having therein not more than 500 microcracks per square centimeter; and
   the quartz glass having a concentration of hydrogen molecules therein of at least $5\times10^{16}$ molecules/cm$^3$; and
   wherein the quartz glass has a DIN bubble classification of 0 or 1, and a double refraction amount of not more than 70 nm/cm.

2. The quartz glass jig of claim 1 wherein the quartz glass has an inner transmittance for an ultraviolet ray of 200 mn wavelength of at least 80% and an apparent transmittance of from 30% to 85%.

3. The quartz glass jig of claim 2 wherein the quartz glass has a fictive temperature established in the range of from 800 to 1,200 degrees C.

4. The quartz glass jig of claim 3 wherein the quartz glass is a synthetic quartz glass obtained by hydrolyzing a silicon compound in a vapor phase thereof.

5. The quartz glass jig of claim 2 wherein the quartz glass is a synthetic quartz glass obtained by hydrolyzing a silicon compound in a vapor phase thereof.

6. The quartz glass jig of claim 1 wherein the quartz glass has a fictive temperature established in the range of from 800 to 1,200 degrees C.

7. The quartz glass jig of claim 6 wherein the quartz glass is a synthetic quartz glass obtained by hydrolyzing a silicon compound in a vapor phase thereof.

8. The quartz glass jig of claim 1 wherein the quartz glass is a synthetic quartz glass obtained by hydrolyzing a silicon compound in a vapor phase thereof.

* * * * *